United States Patent [19]

Bateman et al.

[11] 4,240,030
[45] Dec. 16, 1980

[54] INTELLIGENT ELECTRIC UTILITY METER

[76] Inventors: Jess R. Bateman, 1516 Esplanade Ave., Redondo Beach, Calif. 90277; Robert L. Carpenter, 12,032 Freeman Ave.; Ross K. Smith, 5435 W. 124th St., both of Hawthorne, Calif. 90250

[21] Appl. No.: 969,303

[22] Filed: Dec. 14, 1978

[51] Int. Cl.³ .............................................. G01R 1/00
[52] U.S. Cl. ............................. 324/110; 346/14 MR; 235/449
[58] Field of Search ................. 324/51, 110, 113, 157; 364/483; 235/449, 493; 346/14 MR; 307/140

[56] References Cited

U.S. PATENT DOCUMENTS

| | | | |
|---|---|---|---|
| 2,019,866 | 11/1935 | Morton | 324/110 |
| 3,001,846 | 9/1961 | Franceschini | 346/14 MR |
| 3,380,064 | 4/1968 | Norris et al. | 346/14 MR |
| 3,778,637 | 12/1973 | Arita | 307/140 |
| 3,835,301 | 9/1974 | Barney | 235/61.11 |
| 4,019,135 | 4/1977 | Lofdahl | 324/110 |

*Primary Examiner*—Michael J. Tokar
*Attorney, Agent, or Firm*—Poms, Smith, Lande & Rose

[57] ABSTRACT

A conventional electric utility meter is equipped with special circuitry and components which work in conjunction with an inserted magnetic card to regulate the supply of electricity to the structure to which the unit is attached. In addition to including the conventional dials which indicate overall kilowatt hours, the exterior of the unit includes a receptacle for the card and additional displays which show the kilowatt hours, and corresponding dollar value thereof, for the current payment period. The special circuitry includes a microprocessor, a set of magnetic read/write/erase heads, and a power relay. The circuitry interfaces with the conventional meter components by means of a photocell positioned above apertures or notches in the rotating disk of the meter. In the primary mode of operation, a prepayment card is inserted containing a predetermined kilowatt hour credit. The special circuitry senses this amount and adds it to the amount of power the customer is entitled to receive. Also, the circuitry warns the customer when only a small electricity credit remains. In an alternative mode, a blank postpayment card is inserted into the unit and the amount of the electricity utilized during the current payment period is encoded on the card. The card is then sent to the utility company as the basis of a future billing. Finally, the unlocking of the meter unit case is controlled by a special card code.

15 Claims, 6 Drawing Figures

U.S. Patent  Dec. 16, 1980  Sheet 1 of 4  4,240,030
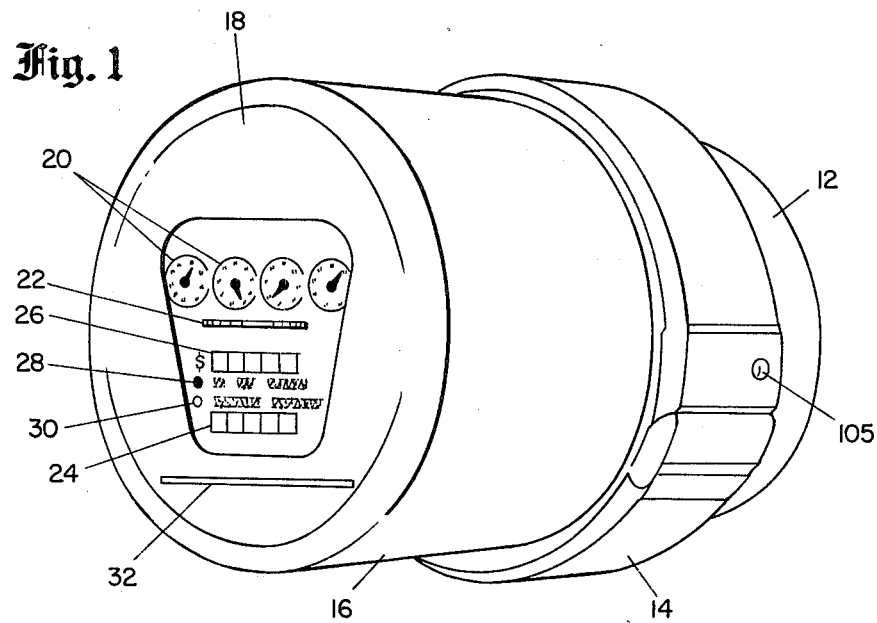
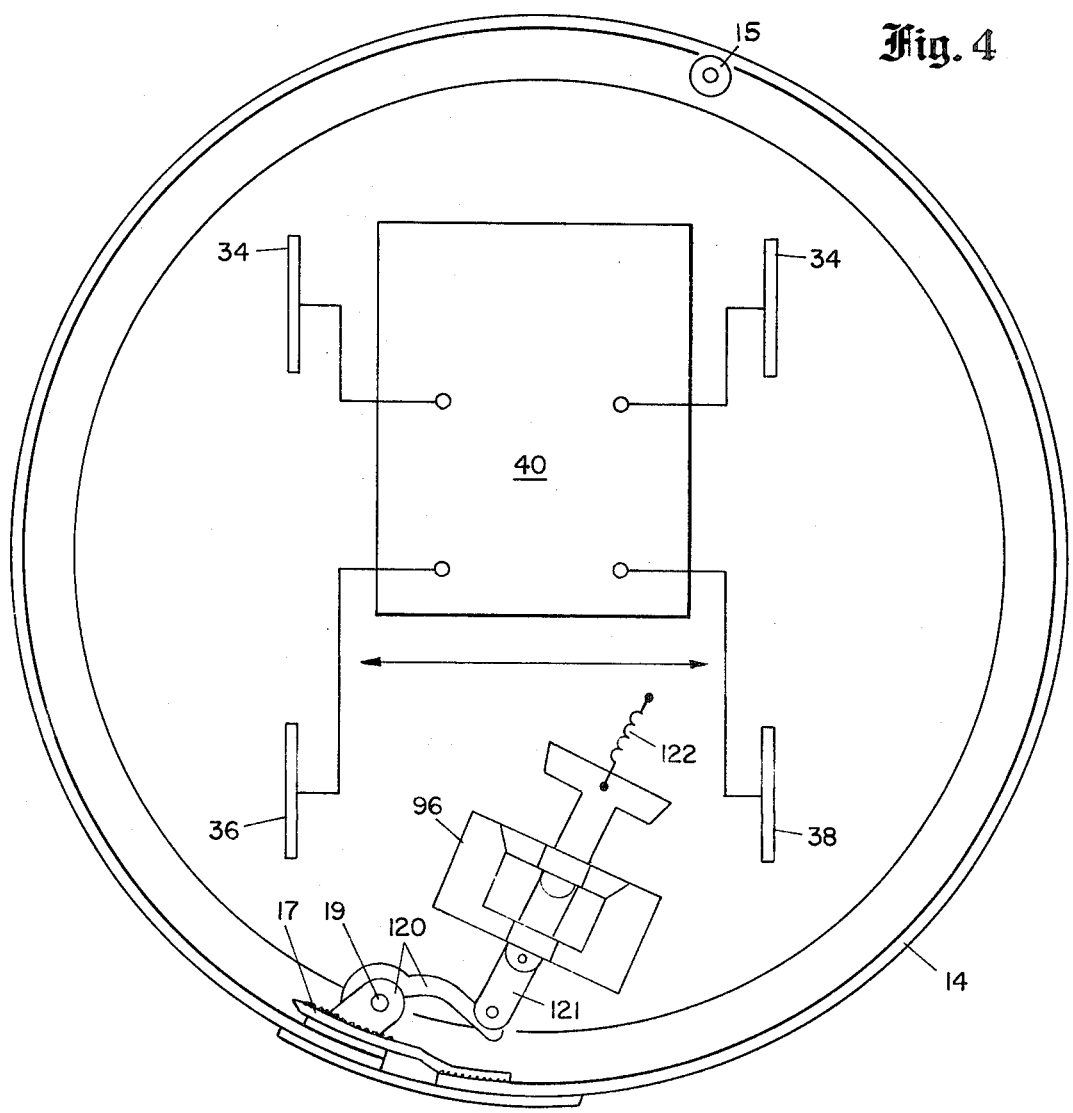

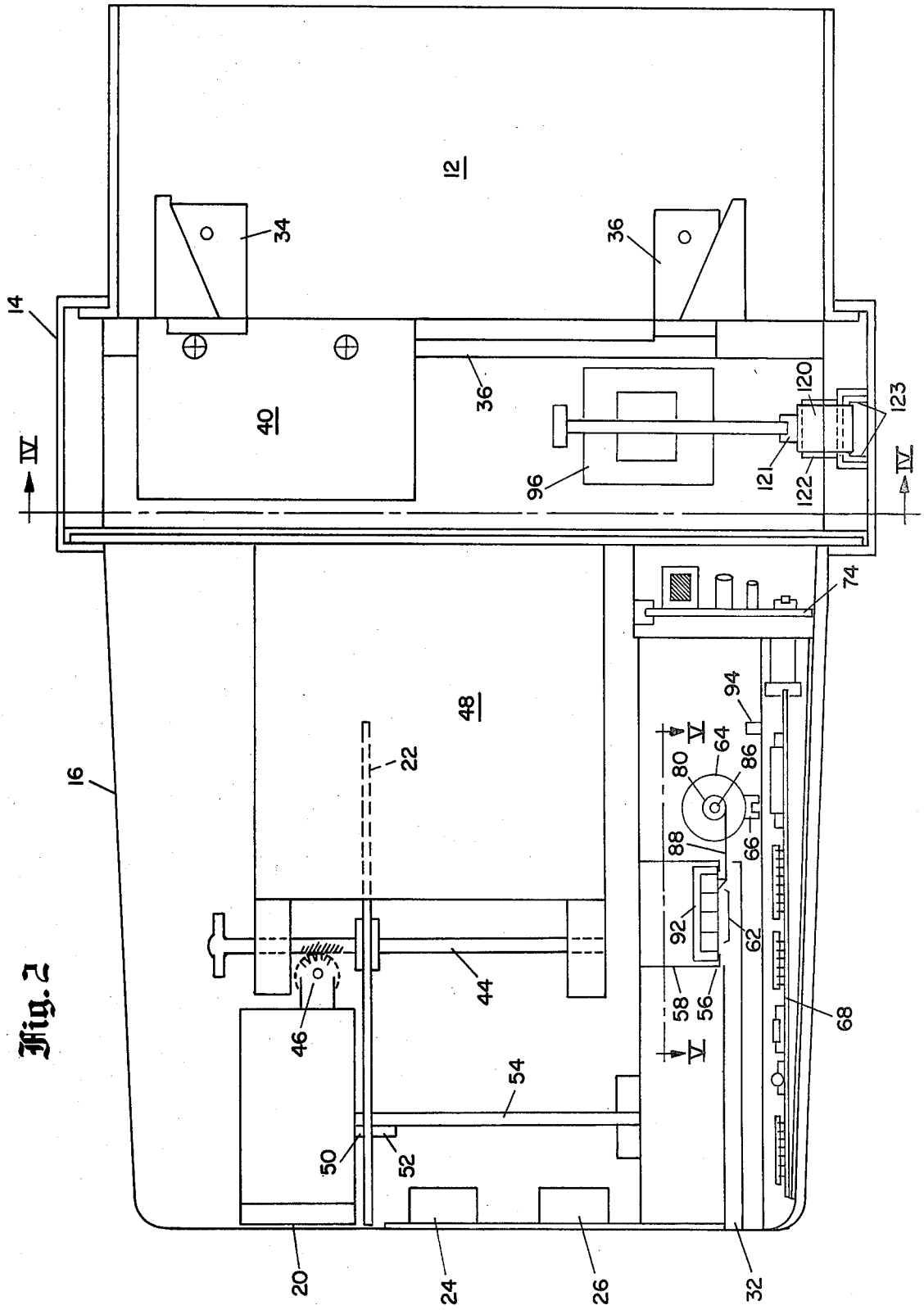

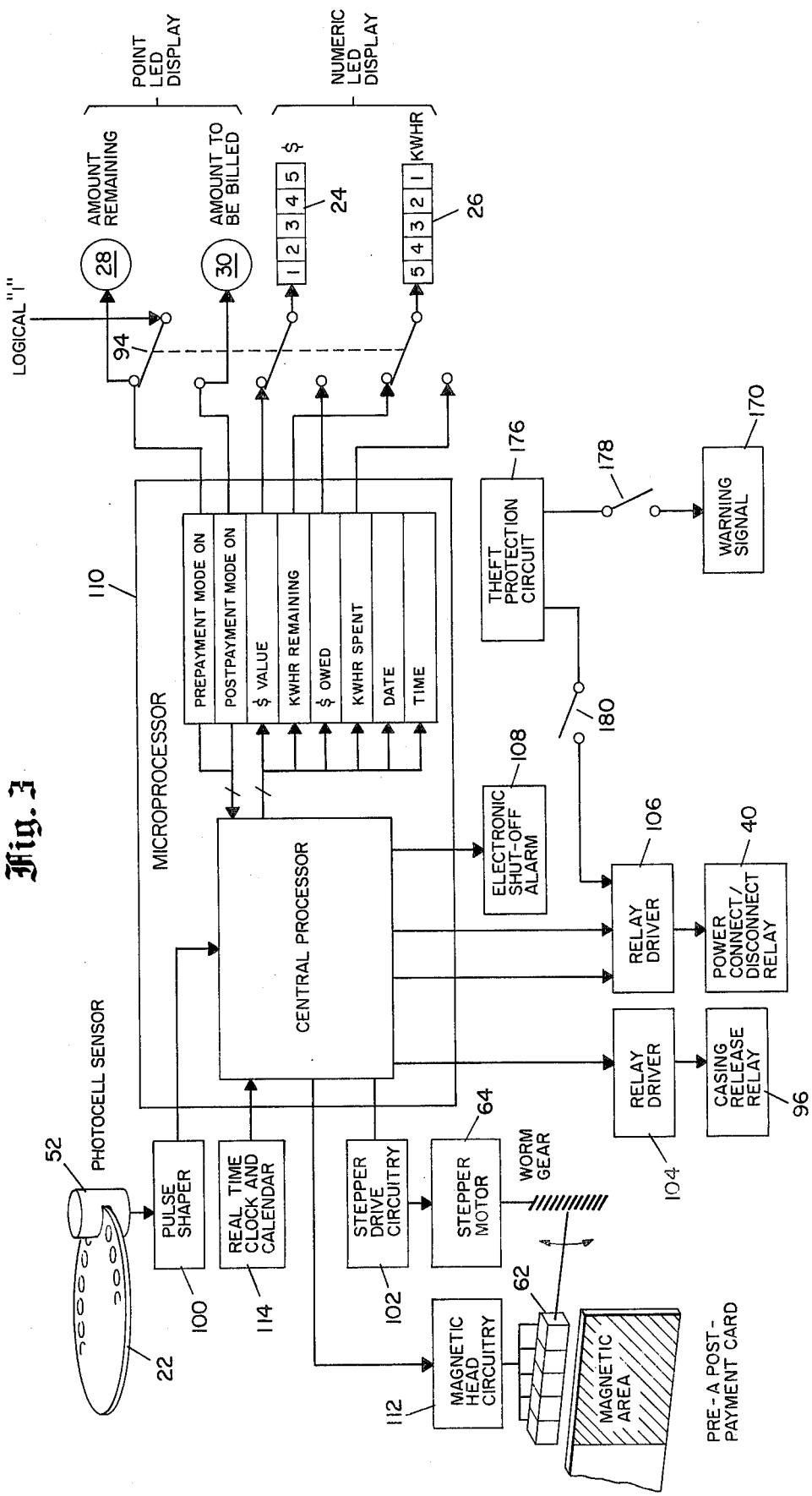

INTELLIGENT ELECTRIC UTILITY METER

FIELD OF THE INVENTION

This invention relates to electric utility meter units, and more particularly to arrangements for improving the payment methodologies relative to, and for increasing the security of, these units.

BACKGROUND OF THE INVENTION

Utility companies frequently encounter problems with the collection of bills and the theft of electricity. In order to overcome these problems, various proposals have been made, none of which has proven effective up to the present time. For example, one system for the prepayment of electrical power is disclosed in U.S. Pat. No. 3,778,637, granted Dec. 11, 1973. This patent discloses the use of a prepayment chip which is inserted into a receptacle in order to enable a measured quantity of electricity to be supplied to the user. An alarm system is activated in advance of the discontinuation of service which occurs when the measured amount of power is used up. A fuse in each chip is melted for the purpose of precluding reuse of the chip. It has also been proposed that a utility meter unit be supplied with a stack of bills. At the end of each month, the meter unit would print and dispense a bill for mailing by the customer to the utility company along with a check for the indicated amount.

Systems of the type described above have been rather crude and thus have not been well received. Accordingly, a principal object of the present invention is to provide an improved electric utility meter unit which facilitates payment collection and has increased security.

SUMMARY OF THE INVENTION

In one illustrative embodiment, a conventional type of electric utility meter is equipped with special circuitry and components which work in conjunction with an inserted card having an encodable medium included in it to regulate the supply of electricity to the home or other structure to which electricity is to be provided. The card may, for example, have a magnetic coating or layer included in its structure for receiving coded information. The unit operates in one of two modes, as determined by an internal switch. In the prepayment mode, the encoded card, which is similar in shape to a conventional credit card, has encoded upon it a credit for a predetermined amount of electricity. When the card is inserted, the unit senses and adds this credit to the present allocation of electricity, which has been determined by prior cards. As the card is removed, it is erased by the unit so as to prevent reuse. Power is automatically shut off when the prepaid amount of electricity runs out.

In the postpayment mode, when a special postpayment type encodable card is inserted into the unit, the amount of electricity utilized during the current payment period is encoded on the card. The card is then mailed to the utility company either with a check or as the basis of a future billing.

The card is inserted into a receptacle on the front of the unit. In accordance with one feature of the invention, a set of magnetic read/write/erase heads decodes, encodes, and/or wipes clean the card. The heads are moved over the magnetic area on the card by a stepper motor. Information is encoded in the magnetic area of the card in a simple grid so as to facilitate easy reading and writing.

In accordance with a broader aspect of the invention, the encodable cards need not be provided with a magnetizable surface, to be read by movable magnetic heads, but may be in another form. For example, the cards may be provided with a magnetic surface which is encoded and decoded by an array of very small stationary heads, similar in spacing to the cores employed in magnetic core memories, with the gap in each core facing the magnetic surface on the card. Alternatively, semiconductive, electrostatic or other memory arrays may be employed. In this regard, reference is made to U.S. Pat. No. 3,835,301, granted Sept. 10, 1974. This patent describes a method of card encoding and decoding utilizing high voltages which create conductive zones on the card. Coding methodologies similar to this could be employed in the present invention to transfer information between the inserted card and the computing circuitry within the unit.

The card reading and writing circuitry is connected to a microprocessor or similar logical circuitry. The microprocessor operation in the two modes noted above is as follows. In the prepayment mode, the microprocessor maintains, in internal registers, the kilowatt hours, and corresponding dollar value thereof, which the customer has remaining from the previous time a card was inserted. The microprocessor adds to the amounts in these registers the credit from the new card. In the postpayment mode, the microprocessor maintains, in the internal registers, the kilowatt hours utilized during the current billing period and the corresponding dollar value thereof.

External displays may be provided to indicate whether the unit is in the prepayment or postpayment mode, as well as showing the kilowatt hours and corresponding dollar value. These displays are in addition to the conventional dial displays which show the total kilowatt hours utilized.

In accordance with one aspect of the invention, the unit may be provided with a warning signal which, when the unit is in the prepayment mode, may alert the user when the remaining power allotment reaches a predetermined level.

In accordance with another aspect of the invention, the meter unit is normally locked and unlocked by inserting a card bearing a special code into the unit.

In accordance with another feature of the invention, utility companies may readily shift over in a gradual way to the new modes of operation, and retain full checking capability and control during the transition. Further, computer checks on electricity usage may be made, and suspicious use patterns may be checked out more closely. To implement these checks, the cards may be encoded uniquely with a serial number identifying the meter, and each card may be used only in the specific meter, which checks the encoded card with the internal meter number. Further, as a condition for receiving the next card in a routine manner, the previous card must have been inserted into the proper meter and subsequently mailed back to the utility company. Through these controls, the likelihood that used cards will be recoded and used again is reduced, and the computer checks of electricity usage will focus attention on potential fraud situations so that they can be dealt with in an appropriate manner.

In addition, in accordance with another aspect of the present system, a circuit for detecting the theft of electricity may include balanced warning circuitry, to verify that the current at the input to the meter is equal to the actual load current, with the circuit providing an output warning or control signal when an imbalance is detected, indicating tampering with current flow through the meter.

Also, instead of having each unit capable of operating in either the prepayment or postpayment mode, separate meter units may be provided for each of these two modes.

It may also be noted that the present unit is applicable to other utilities, such as gas or water, in addition to or instead of electricity.

Other objects, features, and advantages of the invention will become apparent from a consideration of the following detailed description and from the accompanying drawings.

BRIEF DESCRIPTION OF THE DRAWINGS

FIG. 1 is an external view of an electric utility meter unit illustrating the principles of the present invention;

FIG. 2 is a schematic side view, partially cut away, indicating the physical construction of the unit of FIG. 1;

FIG. 3 is a block diagram of the circuitry included in the unit of FIGS. 1 and 2;

FIG. 4 is a schematic view of the intermediate section of the meter unit of FIGS. 1 and 2 taken along plane IV—IV of FIG. 2;

DETAILED DESCRIPTION

Figure 5:
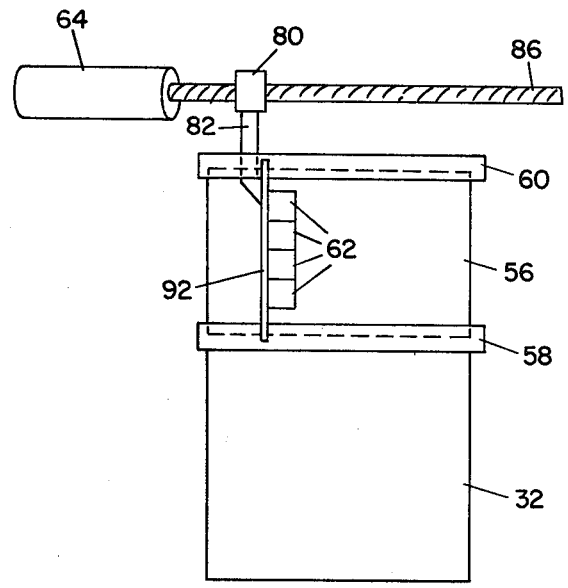
FIG. 5 is a schematic showing of the magnetic head and drive unit taken along lines V—V of FIG. 2.

FIG. 1 shows an external view of the meter unit including a base 12, a locking section 14, and a metal housing 16. Through the opening 18 in the front of the housing 16 are visible a set of conventional electric meter dials 20, a meter disc 22, and two numerical LED displays 24 and 26 which indicate kilowatt hours and the corresponding dollar value thereof, respectively. In addition, two point LED displays 28 and 30 are also located on the front of the unit, and indicate the mode of the operation of the unit. Below the displays 24 and 26 is a slot 32 for receiving a card, similar in shape to a credit card, having a magnetizable area.

FIG. 2 is a schematic cutaway side view of the unit of FIG. 1, showing the meter base 12, the locking section 14, and the forward section of the meter unit including the outer housing 16. Also visible in FIG. 2 are the displays 24 and 26, the meter dial assembly 20, and the slot 32 for receiving cards. The meter base 12 includes a pair of line meter blades 34, which connect the installation to the street power mains, and a pair of load meter blades 36, which connect the power from the street mains to the home or other structure covered by the meter unit. Power is supplied from the line meter blades 34 to the load meter blades 36 through a heavy conductor bus 38 and a power relay 40. The power relay 40 is a heavy-duty unit capable of operating and either closing or breaking a circuit carrying up to 100 amperes. It is operated by an electrical coil, which is not separately shown in FIG. 2.

In the front section of the unit is mounted the meter dial assembly 20, the meter disc 22 pivoting about a shaft 44, and gearing 46 which extends between the shaft 44 and the meter dial assembly 20. A magnet coil 48 rotates the meter disc 22 in a conventional manner to indicate the power consumed at the load meter blades 36. A light 50 and photocell 52 combination is mounted on a post 54 and senses the rotation of the meter disc 22 by means of a hole or notch in the periphery of the disc aligned in the path between the light 50 and the photocell 52. Alternatively, the photocell could be energized by reflected light, and the beam would be interrupted or sharply reduced in intensity by a black line or dot on the disc at the radial point of reflection, as the disc rotates.

In the lower section of the unit is the card receiving receptacle 32 containing an opening 56 at its top rear portion. Above the opening 56 and mounted to a supporting member 90 in the unit are two suspended guide rails 58 and 60. Between the rails 58 and 60 slides an assembly 92 containing a plurality of magnetic read-/write/erase heads 62. These heads are functionally similar to those in magnetic disk storage units found in computer systems. The head assembly 92 is attached by a shaft 82 to a threaded sleeve 80 which rides on a worm gear 86 attached to a stepper motor 64. The motor 64 is attached to the unit by means of a base 66.

Whenever a card is inserted into the card receptacle 32, the motor 64 guides the head assembly 92 over the magnetic area of the card. When the unit is in the prepayment mode, the card is first scanned to read the electricity credit encoded upon it. The card is then erased to prevent reuse. In the postpayment mode, the card is encoded with the amount of electricity utilized during the current billing period. In both modes, a coded meter serial number encoded on the card may be checked and the actual meter number also may be encoded onto the card.

Below the card receptacle 32 is mounted the logic circuit board 68 which contains all the necessary electronics to control the operation of the unit. These are discussed in connection with FIG. 3. The power supply circuit board 74 is located behind the logic circuit board 68, to the right as shown in FIG. 2. This board 74 supplies power to the logic board and to the other specialized electronics in the unit. Next to the power supply circuit board 74 is found a toggle switch 94. This toggle switch 94 connects to the logic circuit board and switches the operational mode of the unit between prepayment and postpayment modes.

Finally, FIG. 2 shows a solenoid 96 which releases an internal case latch 120 on the housing 16 upon the insertion of a card bearing a special code. This feature of the invention greatly reduces the possibility of anyone tampering with the meter unit. The operation of the latch is explained in more detail in connection with the description of FIG. 4.

FIG. 3 shows the circuitry of the logic circuit board 68 in schematic form. The circuitry is composed of a microprocessor 110 and its associated electronics. Because of the rather low level of processing required, the microprocessor 110 can be of the 4-bit variety. The microprocessor can be conceptualized as a central processing unit to which is attached a number of registers. The registers hold the information regarding the current mode of the unit, as well as the kilowatt hours spent or remaining, and the dollar amount owed or accumulated. The registers also contain information regarding the current date and time, which are used by the central processor in the computations it performs. A real-time clock and calendar circuit 114 provides the microprocessor with the basis of the date and time information.

Incidentally, the contents of the registers or the random access memory (RAM) included in the microprocessor 110 may be nonvolatile so that no information is lost in the event of a power failure. This may be accomplished by the use of the so-called "Nitron" memories, or other non-volatile memories disclosed, for example, in the August 1978 issue of IEEE Transactions on Electron Devices, Volume ED-25, No. 8.

The mode of the microprocessor is determined by the toggle switch 94. The switch sets the appropriate bits in the "Mode On" registers in the microprocessor and lights one of the point LED displays 28 or 30 on the front of the unit. The switch also routes the appropriate register outputs to the numeric displays 24 and 26. In the prepayment mode, the "$ Value" and the "KWHR Remaining" registers are routed to the numeric displays 24 and 26. In the postpayment mode, the "$ Owed" and the "KWHR Spent" register outputs are routed to the numeric displays 24 and 26.

The photocell sensor 52 provides the central processor section of the microprocessor with an indication of the rate at which electricity is being used. The microprocessor takes this information and continually updates the "KWHR" and the "$" registers. Because the output of the sensor 52 is unacceptable in its raw form as data for the microprocessor, an external pulse shaping circuit 100 is used to create a rectangular pulse train. It is this pulse train which is then routed to the central processor section of the microprocessor.

When the unit is operating in the prepayment mode, the insertion of the card into the card receptacle 32 causes the microprocessor to send a command to the circuitry 102 which controls the stepper motor 64. The motor 64 then moves the read/write/erase heads 62 sequentially across the magnetic grid on the card. The information sensed is first translated into a purely digital form by the circuitry 112 associated with the heads. This circuitry 112 then transfers the information to the microprocessor. Once in the microprocessor, the information is decoded and the appropriate credit is added to the "KWHR Remaining" and the "$ Value" registers. The microprocessor then applies an erase command to the heads as they move back across the card. This causes the card to be wiped clean and thus rendered nonreusable.

In addition, a "CONNECT" signal is applied over one of the two leads to the power relay 40, to re-establish power to the structure being supplied. Of course, if the card is inserted while power is still connected, the power to the structure remains in the "ON" condition, and no change in the state of relay 40 occurs.

When the electricity allocation has reached a predetermined minimum value without another card having been inserted, the microprocessor activates an alarm circuit 108 which audibly or visually communicates the fact of the rapidly decreasing power allotment to the customer. If another prepayment card is not inserted before the electricity allotment has been dissipated, the microprocessor will energize the other one of the leads to the relay driver 106 to operate the power relay 40 to the "OFF" state. This will remove the supply of electricity from the structure to which the unit is attached.

In the postpayment mode, microprocessor continually updates the "KWHR Spent" and "$ Owed" registers in cooperation with the photocell sensor 52. In this mode, the customer inserts a blank card into the unit. When this occurs, the microprocessor again steps the magnetic heads 62 across the grid and, instead of reading the grid, writes the current values in the "KWHR Spent" and the "$ Owed" registers on the card. The microprocessor then clears these registers and begins accumulating new values in them. The encoded card is then mailed by the customer to the utility company as the basis of a future billing.

In either mode, a special check is made of the card inserted into the unit to see if it contains a special code which unlocks the meter casing. If the card is determined to have the required code, the microprocessor energizes, by means of a relay driver 104, a casing release relay 96. If desired, the meter unit may be provided with a supplemental special mechanical latch to fit the aperture 105 (See FIG. 1) to unlock the meter while the power is off.

FIG. 4, which is taken along plane IV—IV of FIG. 2, shows the intermediate section of the unit and the operation of the casing release relay 96. The power relay 40 connects between the line blades 34 and the load blades 36. As mentioned, the relay 40 is capable of carrying 100 amperes through its contacts. The relay 40 is controlled by the microprocessor on the logic circuit board 68. The casing release relay 96 is also controlled by the microprocessor. The casing 14 is pivoted at 15, and the locking tongue 17 at the other side of the meter unit is engaged by the locking or latching pawl or member 120. The casing release relay plunger is connected to the internal case latch 120 in the locking section 14 by means of a pivoting linkage 121 at the end of the plunger. A spring 122 normally biases the plunger and latch 120 toward the latched position, with the latch being biased counterclockwise about its pivot point 19. When the relay 96 is energized, the plunger moves down, and the latch member 120 rotates clockwise as shown in FIG. 4. This releases the tongue 17 and the locking section 14, enabling it to be removed from the unit. The unit housing 16 can then be removed and the unit can be serviced.

FIG. 5, which is taken along plane V—V of FIG. 2, is a schematic showing of the stepper motor 64 and magnetic head assembly from another orientation. The card receptacle 32 has, at the rear portion of its upper side, an opening 56 of the same size as the magnetic area on the inserted card. Above this opening 56 are two rails 58 and 60 upon which slides an assembly 92 holding a plurality of read/write/erase heads 62. The assembly 92 is connected to a linkage 82. The linkage 82 is connected to a threaded sleeve 80 which rides on a worm gear 86 attached to the stepper motor 64.

The magnetic storage area on the card is in the form of a grid. After the card is inserted, the stepper motor 64 moves the head assembly 92 to each of the columns on the grid. The head assembly 92 then either reads the data bits at the intersection of the column with the row traversed by each head, or writes data bits at those locations. This particular method of getting data in and out of the unit allows much flexibility in the amount and in the format of the data encoded on the card.

Figure 6:
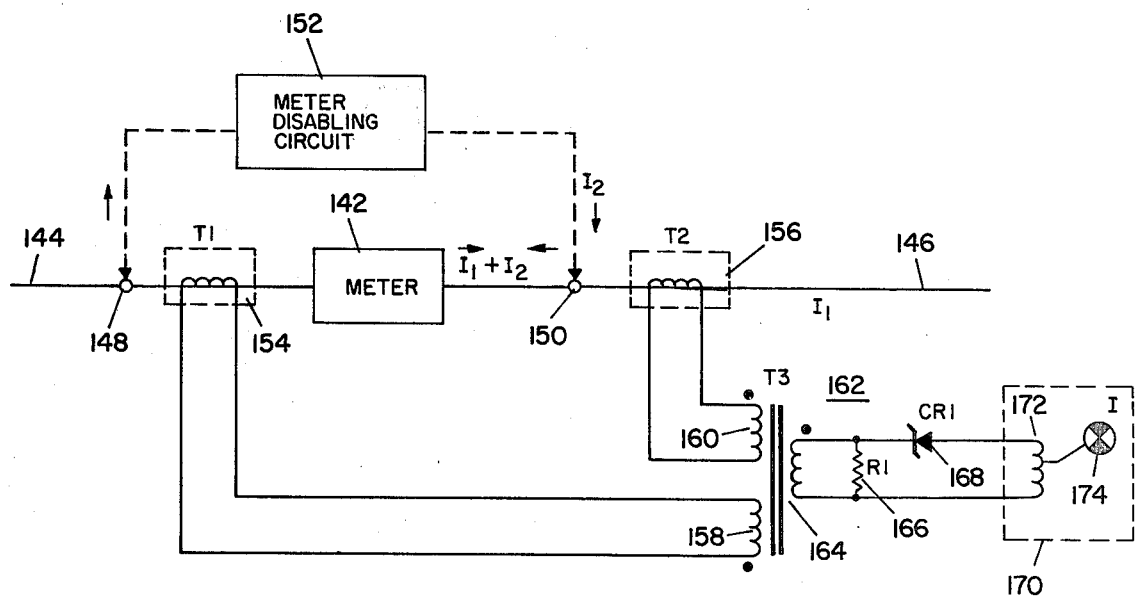
FIG. 6 is a block circuit diagram of a specific form of theft detection circuit.

FIG. 6 is a schematic showing of a theft detection and prevention circuit which is applicable to detect tampering with the meter circuitry of a certain type, as outlined below. With reference more specifically to FIG. 6, the line side of the meter 142 is designated by reference numeral 144, and the load side of the meter 142 is designated by lead 146. For the purposes of the present discussion, it will be assumed that the load current has a value of $I_1$ and this symbol is shown adjacent the load line 146. Shown abridging the meter from point 148 on the line side of the meter to point 150 on the load side of the meter is a meter disabling circuit 152. The meter disabling circuit 152 may produce a phase shift of 180°, and may be adjustable in magnitude. In the present example, it will be assumed that the current through the loop, including the meter disabling circuit 152 and the meter 142, will be equal to $I_2$ and will be 180° out of phase with the current $I_1$. Accordingly, if $I_2$ is adjusted to be equal to $I_1$, then, with the two currents being equal and 180° out of phase, no net current will flow in the meter 142, and it will not rotate.

The theft detection circuit of FIG. 6 includes the two pickup coils 154 and 156, which are coupled in phase opposition to the primary windings 158 and 160 of the transformer 162. Accordingly, if there is no meter disabling circuit 152 present, and if the current into the meter 142 is the same as the current in the load line 146, the currents in the two primary windings 158 and 160 will be equal and little or no current will be transferred to the secondary winding 164 of transformer 162. However, if there is some cancellation of the load current by (1) an oppositely phased meter diabling current, by (2) then the current picked up by the coupling element 154 will be very low, as compared with the load current picked up by the fencing element 156, and there will be an unbalance in transformer 162, so that a substantial current will be present in the secondary 164 of the theft detection circuit. The remaining elements in the theft detection circuit include a resistance 166, a zener diode 168, to provide a threshold level which must be exceeded, and an output warning or power disconnect circuit 170. As shown, the circuit 170 includes an electromagnetically actuated warning element 172, with its associated indicator 174, to signal the presence of some type of meter disabling circuit, such as that indicated and discussed above in connection with block 152.

In the block circuit diagram of FIG. 3, the theft protection circuit of FIG. 6 is indicated by block 176, which is connected by switches 178 and 180 to the warning signal unit 170 and to the relay driver 106 to the power disconnect relay 140. Accordingly, by the closing of switch 178 or switch 180, the system may be set up to either provide merely a warning signal through the unit 170 when an unbalance is determined showing probability of electricity theft, or the power disconnect relay 40 may be directly actuated to turn off the electricity in the structure being served. It is contemplated that the switch 180 would only be closed in the case of repeated instances of power theft; otherwise, there is a certain risk that transient conditions could cause actuation and power turnoff in the structure which always causes inconvenience.

In the foregoing description of the present invention, a preferred embodiment of the invention has been disclosed. It is to be understood that other mechanical and design variations are within the scope of the present invention. Thus, by way of example and not of limitation, displays other than the LED type could be used; the logical functions could be implemented in circuitry other than a microprocessor; and a different method of encoding and decoding the cards could be employed. Accordingly, the invention is not limited to the particular arrangement which has been illustrated and described in detail.

What is claimed is:

1. An improved electric utility meter unit of the type having a meter housing, means for connecting the unit to external power lines, means for connecting the power from the lines to the structure to which the meter unit is associated, and electromechanical measuring means for determining the quantity of electricity passing into the structure, wherein the improvement comprises:
   receptacle means, including a slot in said unit, for receiving a thin rectangular card, such as a credit card, having encodable medium included in its structure;
   circuit means included in said unit for monitoring and regulating the electricity supplied to said structure;
   transducer means for interchanging digital information between said card medium and said circuit means;
   interface means, adapted to work in conjunction with said electromechanical measuring means, for converting the resulting quantity of electricity to a form usable by said circuit means and for transferring said converted quantity to said circuit means; and
   indicator means, controlled by said circuit means, for numerically displaying an indication of the quantity of electricity passing to said structure in a time interval determined upon said insertion of said card.

2. The unit as defined in claim 1, wherein said unit further comprises additional indicator means for numerically displaying the corresponding monetary value of said quantity of electricity displayed on the first of said indicator means.

3. The unit as defined in claim 1, wherein said unit further comprises:
   switching means for automatically disconnecting the electricity to said structure; and
   electrical means, controlled by said circuit means, for activating said switching means, and for thereby turning off said electricity.

4. The unit as defined in claim 1, wherein said circuit means includes control means, responsive to indicia on said card medium indicating a prepaid amount of electricity, for enabling the quantity of electricity encoded upon said medium to pass to said structure.

5. The unit as defined in claim 4, wherein said unit further comprises switching means, working in conjunction with said circuit means, for automatically disabling the supply of electricity from said structure if another of said cards has not been inserted before said prepaid amount is completely utilized.

6. The unit as defined in claim 5, further comprising electrical means for providing a warning signal when the remaining prepaid electricity allotment, prior to said automatic disablement, reaches a predetermined level.

7. The unit as defined in claim 1, wherein said circuit means comprises further circuit means for transferring to said reading and writing means, upon insertion of a card with an unencoded medium, information describing the electricity usage by said structure during a predetermined time interval, said time interval being determined by successive insertions of said card, and said information being thereafter transferred from said reading and writing means to said card medium.

8. The unit as defined in claim 1, further comprising means for switching said circuit means between a prepayment operational mode with automatic electricity disablement in which the amount of electric power supplied by said unit is based upon an electricity credit encoded upon said card medium, and a postpayment operational mode in which the electricity passing through said unit during a predetermined time interval is encoded upon said card medium by said unit when said card is inserted into said unit, said encoded card then forming the basis for a furture billing.

9. The unit as defined in claim 1, further comprising:
latch means for locking said unit; and
electrical means, controlled by said circuit means and responsive to a predetermined code on said card medium, for moving said latch means, thereby locking and unlocking said unit.

10. The unit as defined in claim 7, wherein said unit further comprises display means for indicating whether said unit is in a prepayment operational mode or a postpayment operational mode.

11. A meter unit as defined in claim 3 further comprising means for detecting an imbalance in the current entering said meter and the actual load current, and means responsive to such imbalance for generating an output signal.

12. A meter unit as defined in claim 11 further comprising means for generating a warning signal in response to said output signal.

13. A meter unit as defined in claim 11 further comprising means for operating said switching means to disconnect power to said structure in response to said output signal.

14. An improved utility meter unit of the type having a meter housing, means for connecting the unit to external utility lines, means for supplying the utility from the meter to the structure with which the meter unit is associated, and measuring means for determining the quantity of the utility passing into the structure, wherein the improvement comprises:
receptacle means, including a slot in said unit, for receiving a thin rectangular card, such as a credit card, having encodable medium included in its structure;
circuit means included in said meter unit for monitoring and regulating the utility supplied to said structure;
transducer means for interchanging digital information between said card medium and said circuit means;
interface means, adapted to work in conjunction with said measuring means, for converting the resulting quantity of the utility to a form usable by said circuit means and for transferring said converted quantity to said circuit means; and
indicator means, controlled by said circuit means, for numerically displaying an indication of the quantity of the utility passing to said structure in a time interval determined upon said insertion of said card.

15. The unit as defined in claim 14 wherein said unit further comprises additional indicator means for numerically displaying the corresponding monetary value of said quantity of the utility displayed on the first of said indicator means.

* * * * *